United States Patent
Singh

(10) Patent No.: US 10,474,755 B2
(45) Date of Patent: Nov. 12, 2019

(54) ROBOTICS ASSISTED PRODUCTION SUPPORT UTILITY

(71) Applicant: Bank of America Corporation, Charlotte, NC (US)

(72) Inventor: Awadhesh Pratap Singh, Hyderabad (IN)

(73) Assignee: Bank of America Corporation, Charlotte, NC (US)

( * ) Notice: Subject to any disclaimer, the term of this patent is extended or adjusted under 35 U.S.C. 154(b) by 161 days.

(21) Appl. No.: 15/802,808

(22) Filed: Nov. 3, 2017

(65) Prior Publication Data

US 2019/0138596 A1    May 9, 2019

(51) Int. Cl.

| | |
|---|---|
| *H04L 29/06* | (2006.01) |
| *G06F 17/27* | (2006.01) |
| *G06F 9/54* | (2006.01) |
| *G06Q 10/10* | (2012.01) |
| *H04W 4/12* | (2009.01) |
| *H03M 7/28* | (2006.01) |
| *G06F 9/451* | (2018.01) |
| *G06F 16/84* | (2019.01) |

(52) U.S. Cl.
CPC ............ *G06F 17/277* (2013.01); *G06F 9/454* (2018.02); *G06F 9/541* (2013.01); *G06F 16/84* (2019.01); *G06Q 10/107* (2013.01); *H03M 7/28* (2013.01); *H04W 4/12* (2013.01)

(58) Field of Classification Search
CPC ..................................................... H04W 4/12
See application file for complete search history.

(56) References Cited

U.S. PATENT DOCUMENTS

| | | |
|---|---|---|
| 5,450,470 A | 9/1995 | Alheim |
| 6,321,226 B1 | 11/2001 | Garber et al. |
| 6,408,270 B1 | 6/2002 | Garber |
| 6,748,387 B2 | 6/2004 | Garber et al. |
| 6,760,746 B1 | 7/2004 | Schneider |
| 6,898,761 B2 | 5/2005 | Johnson |
| 7,426,654 B2 | 9/2008 | Adams, Jr. et al. |
| 7,502,781 B2 | 3/2009 | Garber et al. |
| 8,082,471 B2 | 12/2011 | Khan |
| 8,588,416 B2 | 11/2013 | Eigle et al. |

(Continued)

*Primary Examiner* — Adnan M Mirza
(74) *Attorney, Agent, or Firm* — Michael A. Springs; Moore & Van Allen PLLC; Nicholas C. Russell

(57) ABSTRACT

Embodiments of the present invention provide a system for converting ubiquitous language instructions to robotic process automation executable action steps and executing the action steps. A managing system receives an encrypted user input from a computing device of the user, where the user input comprises instructions entered in ubiquitous language (e.g., common vernacular, or other non-complex programming language). The user input is decrypted and an action keyword is identified from the ubiquitous language instructions. The action keyword for each instruction is compared to a conversion database to determine a set of execution steps associated with each action keyword. These execution steps are in a format that enables a robotic process automation system to perform the execution steps. The set of execution steps is then transmitted to the robotic process automation system that automatically performs the set of execution steps through a workstation or other operating station of the user.

17 Claims, 7 Drawing Sheets

(56) References Cited

U.S. PATENT DOCUMENTS

| | | |
|---|---|---|
| 8,700,414 B2 | 4/2014 | Rothermel et al. |
| 8,990,347 B2 | 3/2015 | Schneider |
| 9,471,474 B2 | 10/2016 | Gurumurthy et al. |
| 9,515,994 B2 | 12/2016 | Kaushik et al. |
| 9,555,544 B2 | 1/2017 | Bataller et al. |
| 9,703,624 B2 | 7/2017 | Purushothaman et al. |
| 9,715,675 B2 | 7/2017 | Chakravarty et al. |
| 2008/0065903 A1* | 3/2008 | Goodman ........... G06F 21/6218 713/193 |
| 2012/0260108 A1 | 10/2012 | Lee |
| 2015/0104012 A1* | 4/2015 | Holman ............... H04N 1/4486 380/243 |
| 2015/0201039 A1 | 7/2015 | Schneider |
| 2017/0048058 A1 | 2/2017 | Ren et al. |
| 2017/0220324 A1 | 8/2017 | Balasubramanian et al. |

* cited by examiner

ROBOTICS ASSISTED PRODUCTION SUPPORT UTILITY

BACKGROUND

Production support normally requires highly manual and ad hoc supporting functions and rely heavily on a human workforce to implement actions or processes to resolve inefficiencies and/or improve overall performance. The manual nature of these traditional production support is not conducive for scenarios where a specialist is not available to manually implement certain actions, particularly when the specialist is the most knowledgeable individual or the only qualified individual to address perform these actions. Implementing a ubiquitous language instruction system configurable by the specialist from a remote mobile device that instructs a robotic process automation system to perform a set of execution steps can solve the technical issues of a production support environment that cannot receive direct input from the specialist.

BRIEF SUMMARY

The following presents a summary of certain embodiments of the invention. This summary is not intended to identify key or critical elements of all embodiments nor delineate the scope of any or all embodiments. Its sole purpose is to present certain concepts and elements of one or more embodiments in a summary form as a prelude to the more detailed description that follows.

Embodiments of the present invention address the above needs and/or achieve other advantages by providing apparatuses (e.g., a system, computer program product and/or other devices) and methods for converting ubiquitous language instructions to robotic process automation executable action steps and executing the action steps. The system embodiments may comprise one or more memory devices having computer readable program code stored thereon, a communication device, and one or more processing devices operatively coupled to the one or more memory devices, wherein the one or more processing devices are configured to execute the computer readable program code to carry out the invention. In computer program product embodiments of the invention, the computer program product comprises at least one non-transitory computer readable medium comprising computer readable instructions for carrying out the invention. Computer implemented method embodiments of the invention may comprise providing a computing system comprising a computer processing device and a non-transitory computer readable medium, where the computer readable medium comprises configured computer program instruction code, such that when said instruction code is operated by said computer processing device, said computer processing device performs certain operations to carry out the invention.

For sample, illustrative purposes, system environments will be summarized. The system may involve receiving an encrypted user input from a computing device of a specialist, wherein the user input comprises ubiquitous language instructions. This encrypted user input may be generated by the user in response to a prompt or other request for the user input to resolve or escalate a concern of a business unit, an employee, or the like. The user input may include a unique token generated by or provided to the user (or the computing device of the user), where the unique token is used to encrypt the user input of ubiquitous language instructions and/or to later decrypt the user input. The user input may be generated, transmitted, and received in a short message service (SMS) messaging form.

Once received, the system may then decrypt the encrypted user input to identify the ubiquitous language instructions and identify an action keyword for each instruction of the ubiquitous instructions. The system may, in some embodiments, compare the action keyword for each instruction of the ubiquitous language instructions to a conversion database to determine a set of execution steps associated with each action keyword. Once the set of execution steps have been identified, the system may transmit the set of execution steps to a robotic process automation system.

The robotic process automation system of the system is configured to perform the set of execution steps. Examples of the execution steps performable by the robotic process automation system include, but are not limited to, populating an email message with content; transmitting an email message to a given email address; attaching a document or file to an email message; opening an application or document on a workstation; saving an application or document on a workstation; navigating an online site using a uniform resource locator; adjusting read, write, or access privileges for a document or application; and closing, opening, or restarting an application or operating system.

In some embodiments, the system may additionally identify a format scheme of the ubiquitous language instructions, including known locations of the action keyword for each instruction of the ubiquitous language instructions within the format scheme. Additionally, the system may extract the action keyword for each instruction of the ubiquitous instructions at the known locations of the action keyword for each instruction of the ubiquitous language instructions within the format scheme.

Furthermore, in some embodiments, the system may analyze the ubiquitous language instructions for errors. In response to detecting an error in the ubiquitous language instructions, the system may transmit a notification comprising an indication of the error and a request for a new user input to the computing device of the user. Alternatively, in response to determining that no error exists in the ubiquitous language instructions, the system may transmit the ubiquitous language instructions to the robotic process automation device.

In some embodiments of the system, the conversion database comprises a knowledge base or data repository with known or accepted action keywords and their paired execution steps. Furthermore, this knowledge base or data repository may be configured to utilize machine learning to populate, update, revise, and otherwise improve the knowledge base or extent of action keywords, execution steps, and the relationships between the action keywords and execution steps.

The features, functions, and advantages that have been discussed may be achieved independently in various embodiments of the present invention or may be combined with yet other embodiments, further details of which can be seen with reference to the following description and drawings.

BRIEF DESCRIPTION OF THE DRAWINGS

Figure 1:
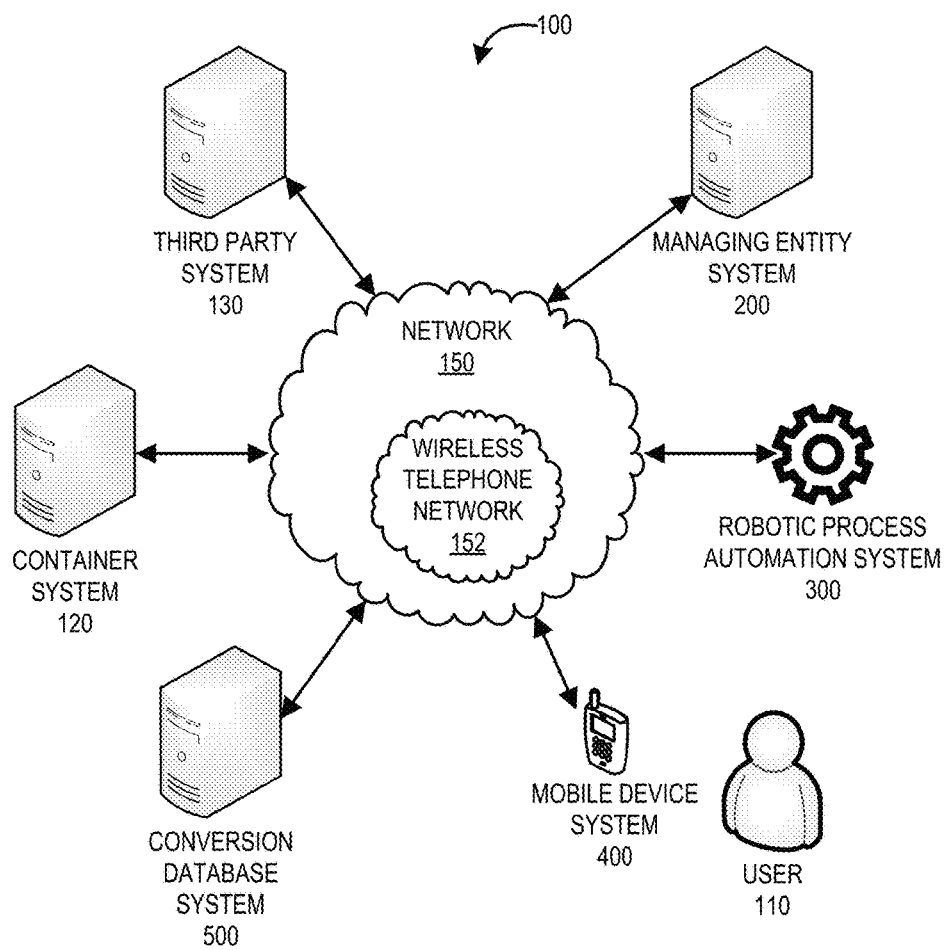
Figure 2:
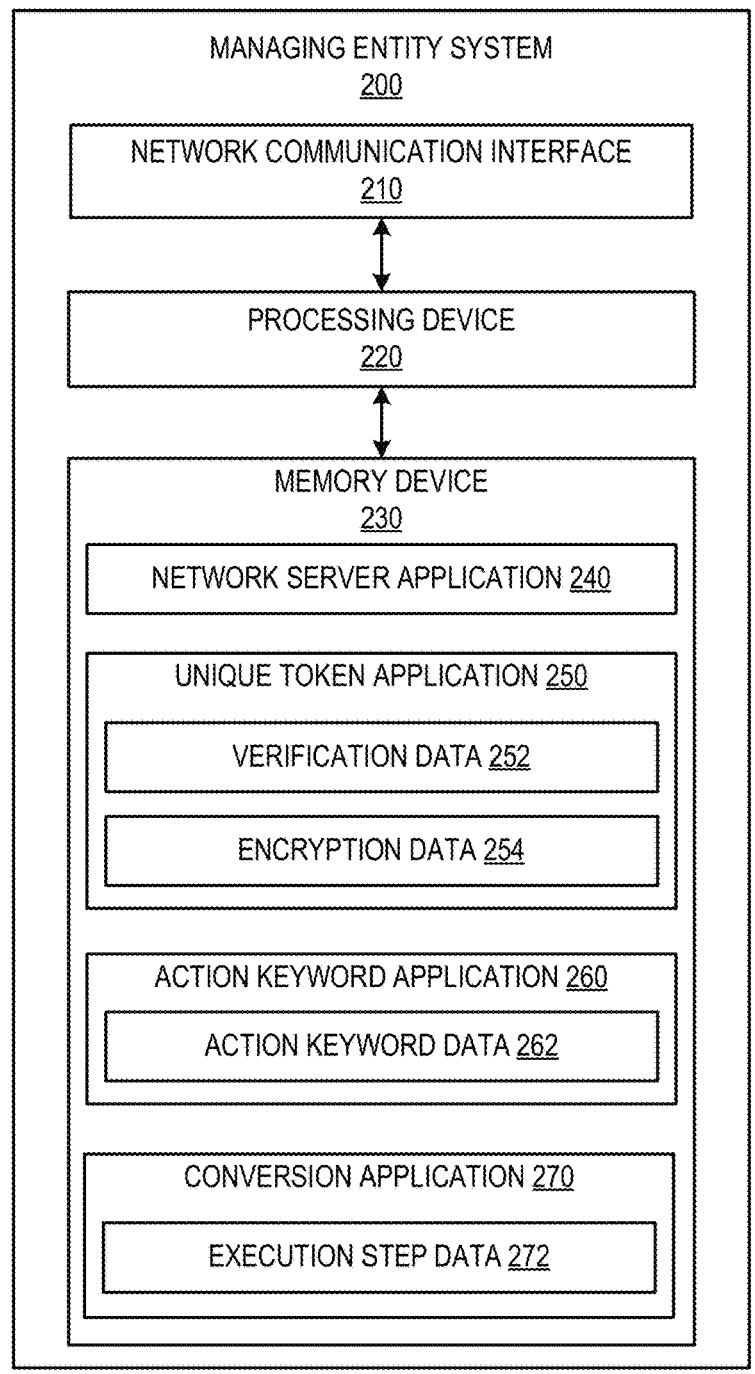
Figure 3:
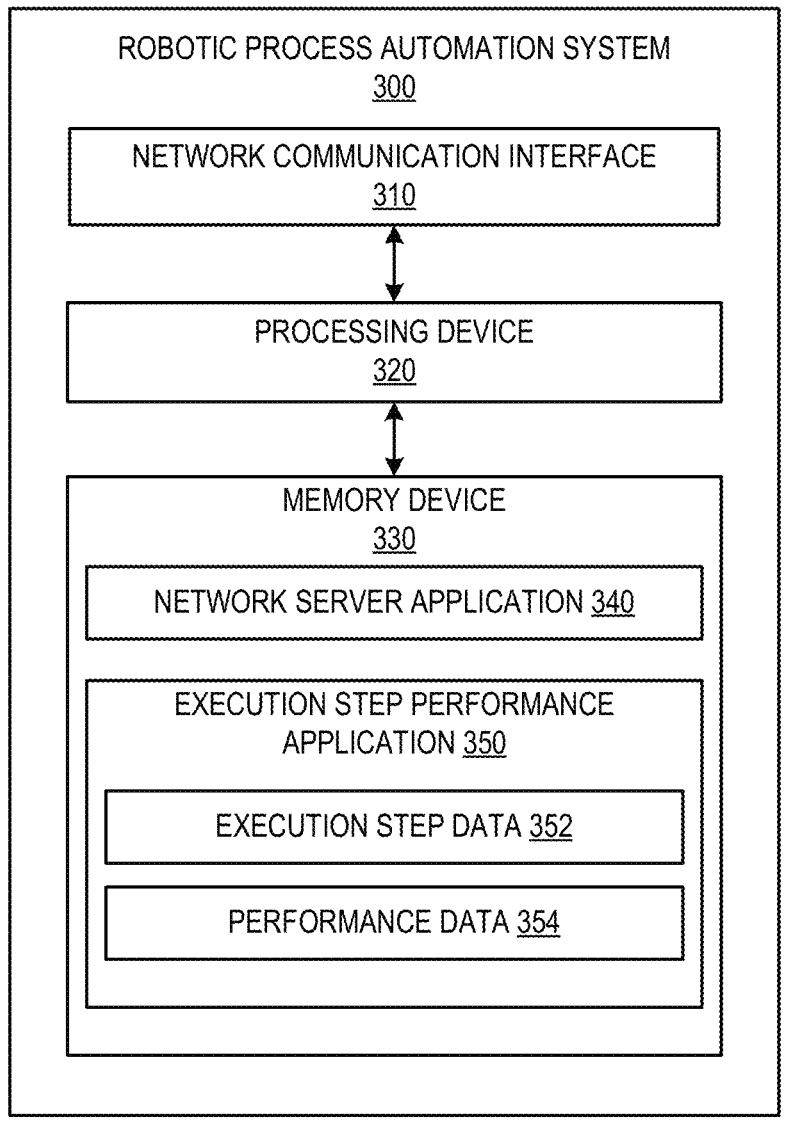
Figure 4:
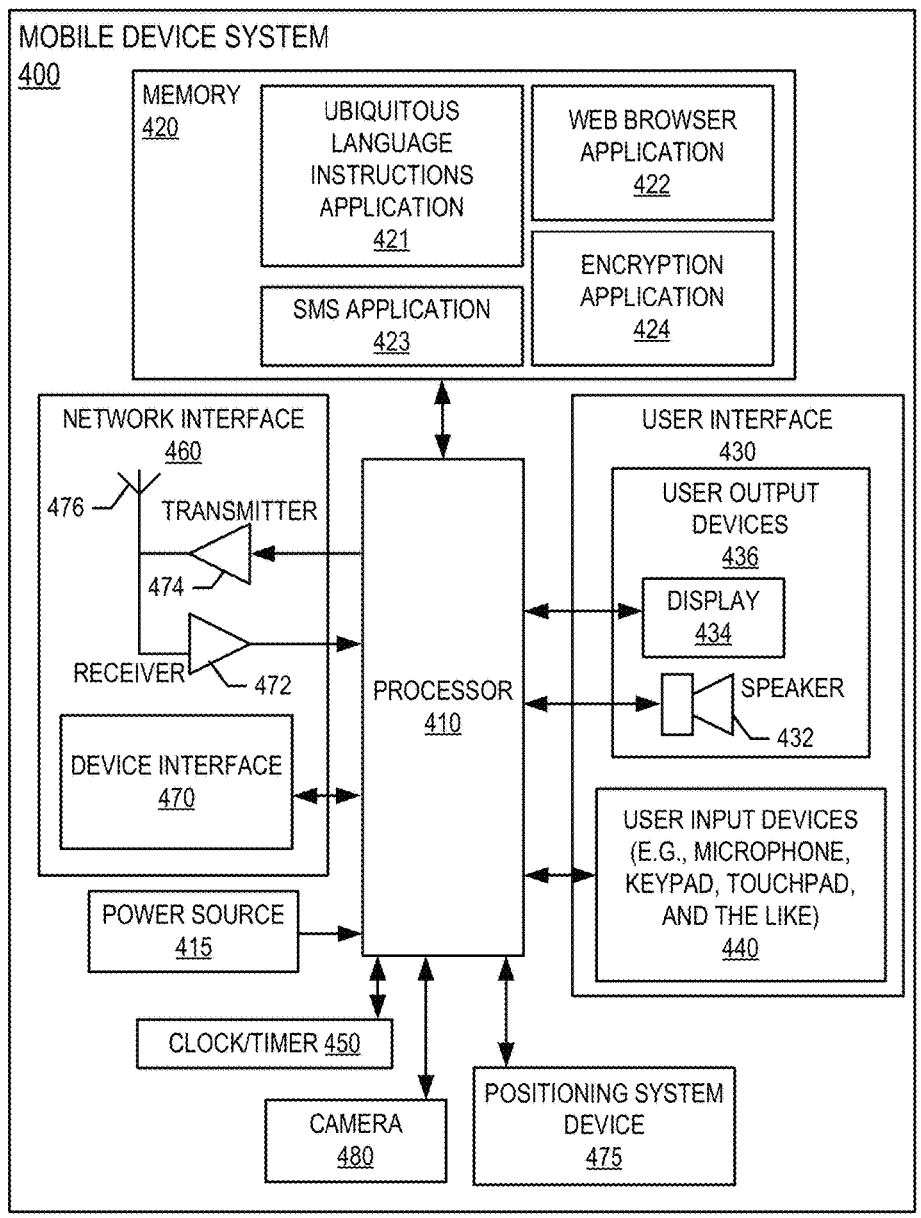
Figure 5:
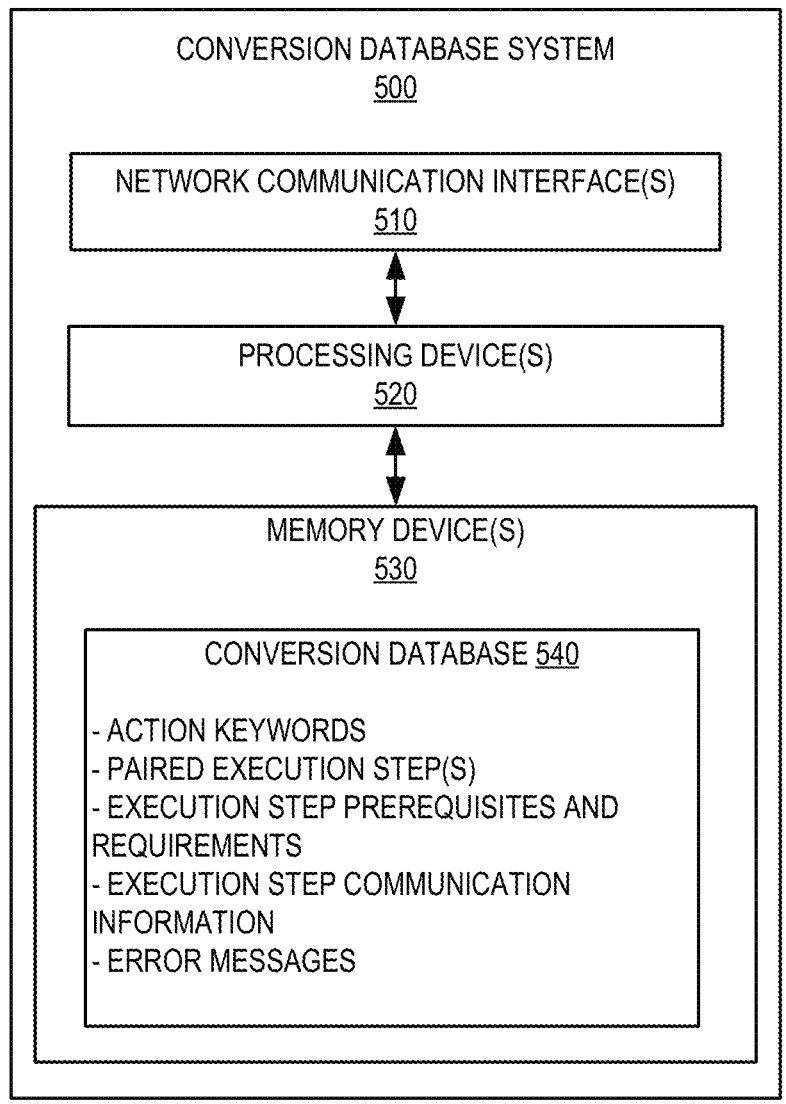
Figure 6:
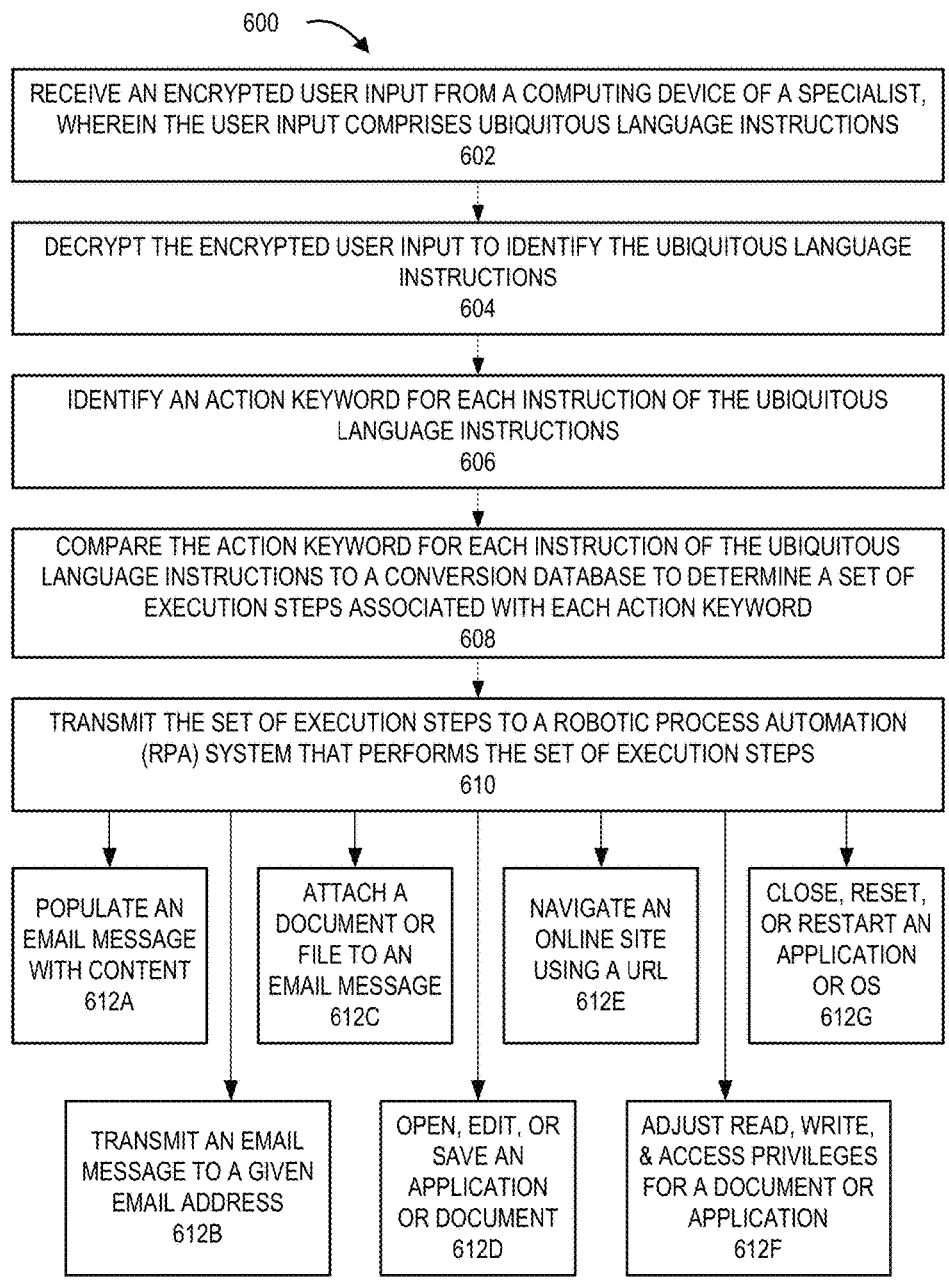
Figure 7:
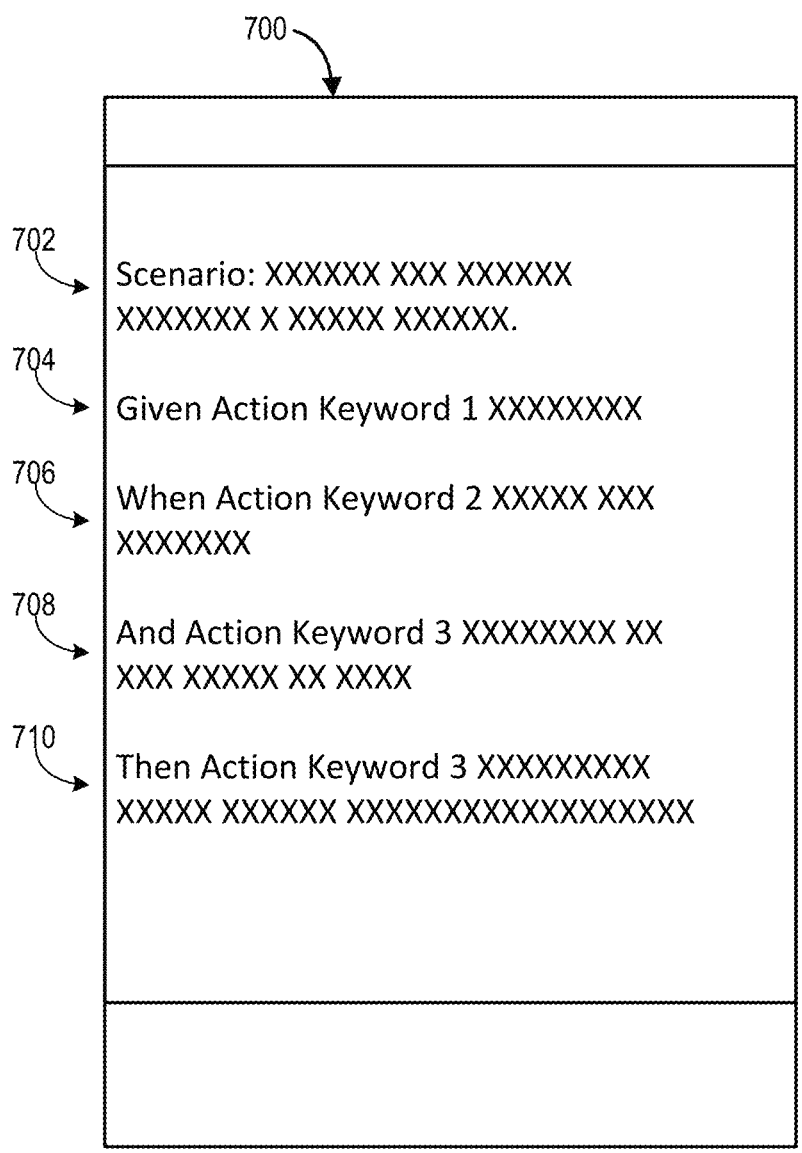

Having thus described embodiments of the invention in general terms, reference will now be made the accompanying drawings, wherein:

FIG. 1 provides a block diagram illustrating a system environment for converting ubiquitous language instructions to robotic process automation executable action steps and executing the action steps, in accordance with an embodiment of the invention;

FIG. 2 provides a block diagram illustrating the managing entity system of FIG. 1, in accordance with an embodiment of the invention;

FIG. 3 provides a block diagram illustrating the robotic process automation system of FIG. 1, in accordance with an embodiment of the invention;

FIG. 4 provides a block diagram illustrating the mobile device system of FIG. 1, in accordance with an embodiment of the invention;

FIG. 5 provides a block diagram illustrating the conversion database system of FIG. 1, in accordance with an embodiment of the invention;

FIG. 6 provides a flowchart illustrating a process for converting ubiquitous language instructions to robotic process automation executable action steps and executing the action steps, in accordance with an embodiment of the invention; and FIG. 7 provides a sample display of the mobile device system of FIG. 1 comprising a ubiquitous language user input, in accordance with embodiments of the invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on." Like numbers refer to like elements throughout.

Embodiments of the present invention provide a system and method for converting ubiquitous language instructions to robotic process automation executable action steps and executing the action steps. A managing system receives an encrypted user input from a computing device of the user, where the user input comprises instructions entered in ubiquitous language (e.g., common vernacular, or other non-complex programming language). The user input is decrypted and an action keyword is identified from the ubiquitous language instructions. If an error is detected, an error reporting message may be transmitted back to the computing device of the user requesting new or updated user input. The action keyword for each instruction is compared to a conversion database to determine a set of execution steps associated with each action keyword. These execution steps are in a format that enables a robotic process automation system to perform the execution steps. The set of execution steps is then transmitted to the robotic process automation system that automatically performs the set of execution steps through a workstation or other operating station of the user. If the robotic process automation system encounters a problem and cannot perform one or more of the execution steps, the robotic process automation system transmits an error notification to the user requesting new or additional user input.

FIG. 1 provides a block diagram illustrating a system environment 100 for converting ubiquitous language instructions to robotic process automation executable action steps and executing the action steps, in accordance with an embodiment of the invention. As illustrated in FIG. 1, the environment 100 includes a managing entity system 200, a robotic process automation system 300, a mobile device system 400, a conversion database system 500, a container system 102, and one or more third party systems 130.

One or more users 110 may be included in the system environment 100. In some embodiments, the user 110 of the system environment 100 may be a specialist that normally operates from a workstation, desktop computer, or other computing device that is configured to perform most or all of the actions the user 110 is employed or tasked to execute. In some embodiments, the user 110 and the mobile device system 400 associated with the user 110 are remote, in that the user 110 is not positioned at the normal workstation and/or is not able to easily access the normal workstation. For example, the user 110 may be travelling or otherwise out of town or the office, normal virtual desktop services are not working or available, or the like.

The managing entity system 200, the robotic process automation system 300, the mobile device system 400, the conversion database system 500, the container system 120, and/or the third party system 130 may be in network communication across the system environment 100 through the network 150. The network 150 may include a local area network (LAN), a wide area network (WAN), and/or a global area network (GAN). The network 150 may provide for wireline, wireless, or a combination of wireline and wireless communication between devices in the network. In one embodiment, the network 150 includes the Internet. In some embodiments, the network 150 comprises a wireless telephone network 152.

The managing entity system 200 may be a system owned or otherwise controlled by a managing entity to perform one or more process steps described herein. In some embodiments, the managing entity is a financial institution. In general, the managing entity system 200 is configured to communicate information or instructions with the robotic process automation system 300, the mobile device system 400, the conversion database system 500, the container system 120, and/or the third party system 130 across the network 150.

For example, the managing entity system 200 may receive encrypted user input from the mobile device system 400, transmit or store the received encrypted user input in the container system 120, decrypt the encrypted user input, compare ubiquitous language instructions from the user input to the conversion database system 500 to identify matching execution steps, transmit the execution steps to the robotic process automation system 300, and the like. Additionally or alternatively, the managing entity system 200 may comprise or include a workstation, set of workstations, email servers, document or application permissions managing system, or the like. Of course, the managing entity system 200 may be configured to perform (or instruct other systems to perform) one or more other process steps described herein. The managing entity system 200 is described in more detail with respect to FIG. 2.

The robotic process automation system 300 may by a system owned or controlled by the managing entity and/or a third party that specializes in providing robotic process automation tools or devices that are configured to receive execution step instructions and to execute those instructions on one or more systems, servers, workstations, and the like. The robotic process automation system 300 may be a distinct server or computing device or, alternatively, may be a component of another system within the system environment (e.g., the managing entity system 200). In general, the robotic process automation system 300 is configured to communicate information or instructions with the managing entity system 200, the mobile device system 400, the conversion database system 500, the container system 120, and/or the third party system 130 across the network 150.

For example, the robotic process automation system 300 may receive a set of execution steps from the managing entity system 200, the mobile device system 400, or the like. Furthermore, the robotic process automation system 300 may be configured to execute or perform one or more execution steps one a server, workstation, computing device, database, or the like within the system environment 100. For example, the robotic process automation system may be configured to log into a workstation (not pictured) of the user 110, open a document on the workstation, edit the document on the workstation, save the document on the workstation, generate an email message, attach the document to the email message, and/or transmit the email message to an email address. Additionally or alternatively, the robotic process automation system 300 may be perform the execution steps of adjusting read, write, or access permissions a document or application for one or more other users. Of course, the robotic process automation system 300 may be configured to perform (or instruct other systems to perform) one or more other process steps described herein. The robotic process automation system 300 is described in more detail with respect to FIG. 3.

The mobile device system 400 may by a system owned or controlled by the managing entity and/or a third party that specializes in providing mobile devices, data transmission, ubiquitous language messaging systems, or the like. The mobile device system 400 may be a mobile telephone, tablet computer, smart watch, or other mobile computing device that can transmit a message to the managing entity system 200 or other devices or systems within the system environment 100. In general, the mobile device system 400 is configured to communicate information or instructions with the managing entity system 200, the robotic process automation system 300, the conversion database system 500, the container system 120, and/or the third party system 130 across the network 150.

For example, the mobile device system 400 may receive a user input from the user 110 in the form of ubiquitous language instructions, encrypt the user input (e.g., using a unique token), and transmit the encrypted user input to the managing entity system 200, the robotic process automation system 300, or the container system 120. Additionally, the mobile device system 400 may receive a prompt for user input, error messages for previous user input, or the like from the managing entity system 200, the robotic process automation system 300, the conversion database system 500, or the container system 120. Of course, the mobile device system 400 may be configured to perform (or instruct other systems to perform) one or more other process steps described herein. The mobile device system 400 is described in more detail with respect to FIG. 4.

The conversion database system 500 may by a system owned or controlled by the managing entity and/or a third party that specializes in data storage, knowledge base systems or networks, machine learning systems, three ways machine learning crunchers, supervised machine learning databases, relational databases, and the like. In general, the conversion database system 500 is configured to communicate information or instructions with the managing entity system 200, the robotic process automation system 300, the mobile device system 400, the container system 120, and/or the third party system 130 across the network 150.

For example, the conversion database system 500 may be accessed by the managing entity system 200, the container system 120, or the robotic process automation system 300 to compare and/or match action keywords to known execution steps. Additionally or alternatively, the conversion database system 500 may continuously or periodically automatically update its database or knowledge base by accessing a third party system 130 that provides a data feed, updated data, a social media platform with new or updated data, or the like. Of course, the conversion database system 500 may be configured to perform (or instruct other systems to perform) one or more other process steps described herein. The conversion database system 500 is described in more detail with respect to FIG. 5.

The container system 120 may be a computing device configured to receive user input (encrypted or decrypted) from the mobile device system 400 and/or the managing entity system 200. The container system 120 may be at least a component of the managing entity system and/or the conversion database system 500. In some embodiments, the container system 120 is configured to decrypt an encrypted user input (e.g., an SMS message) written in ubiquitous language. Additionally or alternatively, the container system 120 may be configured to validate the user input for any errors, inaccuracies, or inconsistencies. Finally, if the container system 120 identifies an error, the container system 120 may be configured to transmit a notification of the error to the mobile device system 400 and/or the managing entity system 200.

The third party system 130 may be any system that provides data, communication resources, or aides the systems and devices of the system environment 100 in any way.

FIG. 2 provides a block diagram illustrating the managing entity system 200, in greater detail, in accordance with embodiments of the invention. As illustrated in FIG. 2, in one embodiment of the invention, the managing entity system 200 includes one or more processing devices 220 operatively coupled to a network communication interface 210 and a memory device 230. In certain embodiments, the managing entity system 200 is operated by a first entity, such as a financial institution, while in other embodiments, the managing entity system 200 is operated by an entity other than a financial institution.

It should be understood that the memory device 230 may include one or more databases or other data structures/repositories. The memory device 230 also includes computer-executable program code that instructs the processing device 220 to operate the network communication interface 210 to perform certain communication functions of the managing entity system 200 described herein. For example, in one embodiment of the managing entity system 200, the memory device 230 includes, but is not limited to, a network server application 240, a unique token application 250 which includes verification data 252 and encryption data 254, an action keyword application 260 which includes action keyword data 262, a conversion application 270 that includes execution step data 272, and other computer-executable instructions or other data. The computer-executable program code of the network server application 240, the unique token application 250, the action keyword application 260, and/or the conversion application 270 may instruct the processing device 220 to perform certain logic, data-processing, and data-storing functions of the managing entity system 200 described herein, as well as communication functions of the managing entity system 200.

In one embodiment, the unique token application 250 includes verification data 252. This verification data 252 may comprise a cryptographic key (e.g., a digital signature, fingerprint details or other biometric data, alpha and/or numeric password information, and the like) that the managing entity system 200 can compare to a received message that includes token information (e.g., information about a token provided by the user 110) to authenticate or validate that the message was sent by the user 110.

The unique token application 250 may also include or comprise encryption data 254. This encryption data may comprise information that enables the managing entity system 200 to decrypt an encrypted user input.

The action keyword application 260 may include action keyword data 262, which may comprise a set of words, phrases, codes, or the like that represent an actionable item. These action keywords may be represented in a ubiquitous language (e.g., a simplified domain-specific language that uses natural constructs to express the behavior and expected outcomes of an action). As such, the action keyword application 260 may be able to analyze a set of text (e.g., a SMS message, user input, and the like) by comparing that text to the action keyword data 262 to identify one or more action keywords that are present in the text.

Examples of ubiquitous language action keyword data 262 includes, but is not limited to, "Cut," "Copy," "Paste," "Navigate," "Address," "URL," "ApplicationName," "Folder," "File," "Insert," "Update," "Delete," "OpenEmail," "SendEmail," "DeleteEmail," "CopyEmail," "Attachment," "ServerName," "DatabaseName," "OperatingSystemName," "ProjectName," "FileName," "Report," "Date," "Time," "Today," "Tomorrow," "Open," "Close," "Click," "Submit," "Select," "Value," "Yes," "No," "Not," "Cancel," "To," "From," and the like.

The conversion application 270 may include execution step data 272, which may comprise executable steps that are performable by a robotic process automation system, along with one or more action keywords that are associated with (e.g., analogous to, shorthand for, and the like) each executable step. Examples of executable steps within the execution step data 272 includes, but is not limited to, instructions for populating email messages with provided content; transmitting email messages to a given email address; attaching a document or file to an email message; opening, editing, or saving an application or document; navigating an online site using a given URL; adjusting read, write, and access privileges for a document or application; closing, resetting, or restarting an application or operating system; approving or declining requests for access to documents or applications; generating reports; production monitoring tasks; and the like.

Furthermore, the executable steps of the execution step data may be paired with related action keywords from the action keyword data 262. For example, the action keywords of "SendEmail," "From," and "To" can all be associated with an execution step of transmitting an email address from a given address to a given address. Of course, other action keywords may be linked to the same execution step. For example, the set of "SendEmail," "Sender," and "Recipient" can represent the same execution step of transmitting an email address from a given address to a given address. The execution step data 272 allows multiple different types of keyword input to represent the same execution step, thereby not limiting a user (e.g., the user 110) in the wording of ubiquitous language instructions it provides in the user input.

The execution step data 272 may simply comprise an instruction that can be read by the robotic process automation system 300, where the robotic process automation system 300 is configured to match the instruction to computer readable instructions for carrying out the execution step. In other embodiments, the execution step data 272 includes or comprises the computer readable instructions that can be transmitted to the robotic process automation system 300 to cause the robotic process automation system to perform the execution step.

The execution step data 272, and its pairings with the action keyword data 262, aide the conversion application 270 in matching an execution step to one or more action keywords that have been found in ubiquitous language instructions (e.g., an SMS message). In some embodiments, the execution step data 272 is stored in the conversion database system 500 and/or the container system 120.

The network server application 240, the unique token application 250, the action keyword application 260, and the conversion application 270 are configured to invoke or use the verification data 252, action keyword data 262, the conversion application 270, and the like when communicating through the network communication interface 210 with the robotic process automation system 300, the mobile device system 400, the conversion database system 500, the container system 120, and/or the third party system 130.

As used herein, a "communication interface" generally includes a modem, server, transceiver, and/or other device for communicating with other devices on a network, and/or a user interface for communicating with one or more customers. Referring again to FIG. 2, the network communication interface 210 is a communication interface having one or more communication devices configured to communicate with one or more other devices on the network 150, such as the robotic process automation system 300, the mobile device system 400, the conversion database system 500, the container system 120, and/or the third party system 130, and the like. The processing device 220 is configured to use the network communication interface 210 to transmit and/or receive data and/or commands to and/or from the other devices connected to the network 150.

FIG. 3 provides a block diagram illustrating the robotic process automation system 300, in greater detail, in accordance with embodiments of the invention. As illustrated in FIG. 3, in one embodiment of the invention, the robotic process automation system 300 includes one or more processing devices 320 operatively coupled to a network communication interface 310 and a memory device 330. In certain embodiments, the robotic process automation system 300 is operated by a first entity, such as a financial institution, while in other embodiments, the robotic process automation system 300 is operated by an entity other than a financial institution.

It should be understood that the memory device 330 may include one or more databases or other data structures/repositories. The memory device 330 also includes computer-executable program code that instructs the processing device 320 to operate the network communication interface 310 to perform certain communication functions of the robotic process automation system 300 described herein. For example, in one embodiment of the robotic process automation system 300, the memory device 330 includes, but is not limited to, a network server application 340, an execution step performance application 350 which includes execution step data 352 and performance data 354, and other computer-executable instructions or other data. The computer-executable program code of the network server application 340, the execution step performance application 350 may instruct the processing device 320 to perform certain logic, data-processing, and data-storing functions of the robotic process automation system 300 described herein, as well as communication functions of the robotic process automation system 300.

In one embodiment, the execution step performance application 350 includes execution step data 352 and performance data 354. The execution step data 352 may comprise data similar or identical to the execution step data 272 associated with the conversion application 270 of the managing entity system 200. In embodiments where the execution step data 272 of the managing entity system 200 comprises simple instructions for the robotic process automation system 300, the execution step data 352 may comprise data or information necessary to convert the simple instructions to computer readable instructions for carrying out the execution step of the simple instructions.

Additionally, the performance data 354 may include contact information, address information, workstation information, error tracking information, and the like that is necessary for carrying out the execution steps. For example, the performance data 354 may include information on default workstation units to work from, email addresses to send email messages from, login credentials for the user 110, and the drivers, applications, and other mechanisms necessary for carrying out the execution steps.

The network server application 340 and the execution step performance application 350 are configured to invoke or use the execution step data 352, the performance data 354, and the like when communicating through the network communication interface 310 with the managing entity system 200, the mobile device system 400, the conversion database system 500, the container system 120, and/or the third party system 130.

FIG. 4 provides a block diagram illustrating a mobile device system 400 of FIG. 1 in more detail, in accordance with embodiments of the invention. In one embodiment of the invention, the mobile device system 400 is a mobile telephone. However, it should be understood that a mobile telephone is merely illustrative of one type of mobile device system 400 that may benefit from, employ, or otherwise be involved with embodiments of the present invention and, therefore, should not be taken to limit the scope of embodiments of the present invention. Other types of mobile device systems 400 may include portable digital assistants (PDAs), pagers, mobile televisions, gaming devices, laptop computers, cameras, video recorders, audio/video player, radio, global positioning system (GPS) devices, or any combination of the aforementioned.

Some embodiments of the mobile device system 400 include a processor 410 communicably coupled to such devices as a memory 420, user output devices 436, user input devices 440, a network interface 460, a power source 415, a clock or other timer 450, a camera 480, and a positioning system device 475. The processor 410, and other processors described herein, generally include circuitry for implementing communication and/or logic functions of the mobile device system 400. For example, the processor 410 may include a digital signal processor device, a microprocessor device, and various analog to digital converters, digital to analog converters, and/or other support circuits.

Control and signal processing functions of the mobile device system 400 are allocated between these devices according to their respective capabilities. The processor 410 thus may also include the functionality to encode and interleave messages and data prior to modulation and transmission. The processor 410 can additionally include an internal data modem. Further, the processor 410 may include functionality to operate one or more software programs, which may be stored in the memory 420. For example, the processor 410 may be capable of operating a connectivity program, such as a web browser application 422. The web browser application 422 may then allow the mobile device system 400 to transmit and receive web content, such as, for example, location-based content and/or other web page content, according to a Wireless Application Protocol (WAP), Hypertext Transfer Protocol (HTTP), and/or the like.

The processor 410 is configured to use the network interface 460 to communicate with one or more other devices on the network 150. In this regard, the network interface 460 includes an antenna 476 operatively coupled to a transmitter 474 and a receiver 472 (together a "transceiver"). The processor 410 is configured to provide signals to and receive signals from the transmitter 474 and receiver 472, respectively. The signals may include signaling information in accordance with the air interface standard of the applicable cellular system of the wireless telephone network 152. In this regard, the mobile device system 400 may be configured to operate with one or more air interface standards, communication protocols, modulation types, and access types. By way of illustration, the mobile device system 400 may be configured to operate in accordance with any of a number of first, second, third, and/or fourth-generation communication protocols and/or the like. For example, the mobile device system 400 may be configured to operate in accordance with second-generation (2G) wireless communication protocols IS-136 (time division multiple access (TDMA)), GSM (global system for mobile communication), and/or IS-95 (code division multiple access (CDMA)), or with third-generation (3G) wireless communication protocols, such as Universal Mobile Telecommunications System (UMTS), CDMA2000, wideband CDMA (WCDMA) and/or time division-synchronous CDMA (TD-SCDMA), with fourth-generation (4G) wireless communication protocols, with LTE protocols, with 4GPP protocols and/or the like. The mobile device system 400 may also be configured to operate in accordance with non-cellular communication mechanisms, such as via a wireless local area network (WLAN) or other communication/data networks.

As described above, the mobile device system 400 has a user interface 430 that is, like other user interfaces described herein, made up of user output devices 436 and/or user input devices 440. The user output devices 436 include a display 434 (e.g., a liquid crystal display or the like) and a speaker 432 or other audio device, which are operatively coupled to the processor 410.

The user input devices 440, which allow the mobile device system 400 to receive data from a user such as the user 110, may include any of a number of devices allowing the mobile device system 400 to receive data from the user 110, such as a keypad, keyboard, touch-screen, touchpad, microphone, mouse, joystick, other pointer device, button, soft key, and/or other input device(s). The user interface 430 may also include a camera 480, such as a digital camera.

The mobile device system 400 may also include a positioning system device 475 that is configured to be used by a positioning system to determine a location of the mobile device system 400. For example, the positioning system device 475 may include a GPS transceiver. In some embodiments, the positioning system device 475 is at least partially made up of the antenna 476, transmitter 474, and receiver 472 described above. For example, in one embodiment, triangulation of cellular signals may be used to identify the approximate or exact geographical location of the mobile device system 400. In other embodiments, the positioning system device 475 includes a proximity sensor or transmitter, such as a radio frequency identification (RFID) tag, that can sense or be sensed by devices known to be located proximate a merchant or other location to determine that the mobile device system 400 is located proximate these known devices.

The mobile device system 400 further includes a power source 415, such as a battery, for powering various circuits and other devices that are used to operate the mobile device system 400. Embodiments of the mobile device system 400 may also include a clock or other timer 450 configured to determine and, in some cases, communicate actual or relative time to the processor 410 or one or more other devices.

The mobile device system 400 also includes a memory 420 operatively coupled to the processor 410. As used herein, memory includes any computer readable medium (as defined herein below) configured to store data, code, or other information. The memory 420 may include volatile memory, such as volatile Random Access Memory (RAM) including a cache area for the temporary storage of data. The memory 420 may also include non-volatile memory, which can be embedded and/or may be removable. The non-volatile memory can additionally or alternatively include an electrically erasable programmable read-only memory (EE-PROM), flash memory or the like.

The memory 420 can store any of a number of applications which comprise computer-executable instructions/code executed by the processor 410 to implement the functions of the mobile device system 400 and/or one or more of the process/method steps described herein. For example, the memory 420 may include such applications as a conventional web browser application 422, a ubiquitous language instructions application 421, an encryption application 424, any other application provided by the managing entity system 200, or the like. These applications also typically instructions to a graphical user interface (GUI) on the display 434 that allows the user 110 to interact with the mobile device system 400, the managing entity system 200, and/or other devices or systems. In one embodiment of the invention, when the user 110 decides to enroll in a ubiquitous language instructions application 421 program, the user 110 downloads, is assigned, or otherwise obtains the ubiquitous language instructions application 421 from the managing entity system 200, or from a distinct application server (e.g., from the third party system 130). In other embodiments of the invention, the user 110 interacts with the managing entity system 200, the robotic process automation system 300, the conversion database system 500, the container system 120 and/or the third party system 130 via the web browser application 422 in addition to, or instead of, the ubiquitous language instructions application 421.

The memory 420 of the mobile device system 400 may comprise a Short Message Service (SMS) application 423 configured to send, receive, and store data, information, communications, alerts, and the like via the wireless telephone network 152. For example, the user may enter ubiquitous language instructions using the user input devices 440 to the SMS application 423. These ubiquitous language instructions may be encrypted by the encryption application 424 and transmitted to the managing entity system 200 using the SMS application 423.

The memory 420 may also include an encryption application 424. The encryption application 424 may be configured to utilize one or more unique tokens associated with a user 110 to encrypt or decrypt a ubiquitous language message (e.g., in the form of a SMS message) prior to sending the message to the managing entity system 200 or another system or device within the system environment 100.

The memory 420 can also store any of a number of pieces of information, and data, used by the mobile device system 400 and the applications and devices that make up the mobile device system 400 or are in communication with the mobile device system 400 to implement the functions of the mobile device system 400 and/or the other systems described herein. For example, the memory may include unique token data (e.g., for encryption purposes), format schema for ubiquitous language instruction messages, and the like.

Turning now to FIG. 5, a block diagram of a conversion database system 500 is provided, in accordance with embodiments of the invention. As illustrated in FIG. 5, the conversion database system 500 generally includes, but is not limited to, a network communication interface 510, one or more processing devices 520, and one or more memory devices 530. The processing device 520 is operatively coupled to the network communication interface 510 and the memory device 530. In one embodiment of the conversion database system 500, the memory device 530 stores, but is not limited to, a conversion database 540. While not pictured, in some embodiments, the memory device 530 additionally stores a data feed interface that is in network communication with a third party data provider, social media platforms with data that can be added to the memory device 530, and the like.

In some embodiments, the conversion database 540 stores data including, but not limited to, action keywords, execution steps that are paired to the action keywords, execution step prerequisites and requirements, execution step communication information, error messages, and other data or information that will enable the managing entity system 200 and/or the robotic process automation system 300 to match one or more action keywords to their paired execution step(s). Additionally, the conversion database 540 includes other information that will enable the robotic process automation system 300 to carry out or otherwise perform the execution steps. For example, the conversion database may include computer readable instructions that are paired to particular execution steps.

In one embodiment of the invention, the conversion database 570 may associate with applications having computer-executable program code that instructs the processing device 520 to operate the network communication interface 510 to perform certain communication functions involving the conversion database 570 described herein. In one embodiment, the computer-executable program code of an application associated with the conversion database 540 may also instruct the processing device 520 to perform certain logic, data processing, and data storing functions of the application associated with the conversion database 540 described herein.

The network communication interface 510 is a communication interface having one or more communication devices configured to communicate with one or more other devices on the network 150. The processing device 520 is configured to use the network communication interface 510 to receive information from and/or provide information and commands to the managing entity system 200, the robotic process automation system 300, the mobile device system 400, the container system 120, and/or the third party system 130. In some embodiments, one or more of the devices described herein may be operated by a second entity so that the second entity controls the various functions involving the conversion database system 500. For example, in one embodiment of the invention, although the managing entity system 200 is operated by a first entity (e.g., a financial institution), a second entity operates the conversion database system 500 that stores received data in the conversion database 540.

In some embodiments, the conversion database system 500 comprises or utilizes a three ways machine learning cruncher or other supervised machine learning database system to populate and update the conversion database 540. In such embodiments, the conversion database system 500 can utilize reinforced learning to expand the vocabulary of accepted action keywords and/or paired execution steps. For example, the conversion database system 500 may determine that a new action keyword should be paired with a specific execution step (e.g., through user input or verification), and that the execution step is fit to be applied by the robotic process automation system. Once that determination has been made, the conversion database system 500 can store the new action keyword and/or execution step (along with any other necessary prerequisite or requirement data) in the conversion database 540. This will help to grow the conversion database 540 into a knowledge base (or solution repository of repeatable issues) while avoiding the dependency of human intervention the next time the new action keyword is identified in a message.

In another example, the conversion database system 500 may test a new action keyword and paired execution step in a testing or virtual environment before storing the new action keyword and paired execution step in the conversion database 540 for use in a production environment. Furthermore, the conversion database system 500 can prompt a production support staff member with an indication that the conversion database system 500 has identified the new action keyword and paired execution step as likely being functional in the production environment and a request for confirmation that the production support staff member approves of the paired action keyword and execution step for use in the production environment. If the production support staff member approves, then the conversion database system 500 will not be required to prompt a production support staff member for approval of the paired action keyword and execution step in future iterations. Instead, the conversion database system 500 will automatically show a linkage or pairing between the new action keyword and the associated execution step. However, if the production support staff member does not approve of the linkage, then a similar prompt may be provided in a future iteration of the conversion database system 500 receiving a request for conversion of the new action keyword.

Referring now to FIG. 6, a flowchart is provided to illustrate one embodiment of a process 600 for converting ubiquitous language instructions to robotic process automation executable action steps and executing the action steps, in accordance with embodiments of the invention. In some embodiments, the process 600 may include block 602, where the system receives an encrypted user input from a computing device of a specialist, wherein the user input comprises ubiquitous language instructions. In some embodiments, the user input is received in a short message service text messaging form.

The user input comprises instructions in the form of ubiquitous language instructions. The ubiquitous language instructions may be plain English (or another language) instructions using vocabulary or vernacular of common messaging or human communication, as opposed to technical computer programming language, computer readable instructions, or the like. In this way, the user can use common words for performing certain ad hoc tasks without inputting lengthy commands, looking up technical or specific computer readable instructions, or the like.

An example of the user input is shown in the sample display 700 of a mobile device in FIG. 7. This display 700 illustrates an example of how the user input may be entered into the mobile device, with a description of the scenario at a scenario line 702 provided to serve as documentation of what process the user is attempting to execute, why the user is providing the user input, and the like. For example, the scenario may include a written description from the user of emailing a document to a second user. The description of the scenario at the scenario line 702 may be for record-keeping purposes only, or for future reference in the event a production support team member needs to check the user input for information about what the user was trying to accomplish. The "given" line 704, "when" line 706, "and" line 708, and "then" line 710 represents the ubiquitous language instructions that the system is receiving at block 602 of FIG. 6. This user input is provided by the user as user input on the display 700 as ubiquitous language, or common vocabulary and vernacular for the steps that the user would like to be executed by the robotic process automation system.

A container system may be utilized to receive and/or store the encrypted user input. This container system may be a server, machine, an application, or any other data storage system that is configured to receive, decrypt, analyze, and/or store user input data. This container system may be a component of the managing entity system that runs the overall process 600 or it may be a remote or disparate system that can be accessed and utilized by the managing entity system.

A unique token may be embedded in the user input as a verification that the user is the individual that entered the user input, that the mobile device is the mobile device of the user, or the like. In some embodiments, the unique token may enable the encryption of the user input (e.g., as an encryption key). If the system receives a user input without the unique token, the system may reject the user input, end the process, and/or transmit an error message to the computing device of the user.

The user may have been prompted by the system, by another user, or the like, to provide the user input. For example, a second user may need access to a document that is beyond the second user's authorization level. The second user can transmit a message (e.g., an SMS message) to the mobile device of the user requesting authorization of the second user for accessing the document. The user can then enter the appropriate user input, in the form of ubiquitous language instructions, that will eventually lead to the robotic process automation system adjusting the read, write, and access privileges associated with the document such that the second user can then access the document.

Furthermore, as is discussed below, the system may transmit a request for user input (i.e., new or revised user input) in response to determining that an error exists in a previous user input. The user can then enter the new user input to the mobile device of the user and the mobile device of the user will transmit the new user input to the managing entity system.

In some embodiments, the process 600 includes block 604, where the system decrypts the encrypted user input to identify the ubiquitous language instructions. In embodiments where a unique token was used by the computing device of the user to encrypt the user input, this unique token may be used by the managing entity system as an encryption key to decrypt the encrypted user input. By receiving encrypted user input and decrypting the user input, the system provides data security, business security, identity security, and other data and information protection services to the user and the enterprise as a whole. The container system may be used to perform the decryption processes automatically as the user input is received.

At this point in the process 600, the system may check the ubiquitous language instructions for errors. As such, the system may analyze the ubiquitous language instructions for errors. These errors may be typos, unknown formats, unknown words or phrases, or the like. In response to detecting an error in the ubiquitous language instructions, the system may transmit a notification comprising an indication of the error and a request for a new user input to the computing device of the user. The user can adjust the original user input, generating a new user input, and the process 600 can start again at block 602 as the new user input is received. The container system may be configured to check the ubiquitous language instructions for errors, or to validate the ubiquitous language instructions automatically in response to decrypting the user input.

As mentioned above, the action keywords may be in the form of ubiquitous language, which can be a simple domain-specific language (DSL) using natural language constructs (e.g., common English-like sentences) that can express the behavior and expected outcomes of a desired execution step. These words can be in common vernacular, shorthand, or any other form that is easily entered into a mobile device system (e.g., for SMS messaging). The common-nature of the ubiquitous language instructions is an effective technical practice for instructing a robotic process automation system to perform one or more action steps without requiring the user to enter heavily structured, detailed, or complex programming language code.

Additionally, in some embodiments, the process 600 includes block 606, where the system identifies an action keyword for each instruction of the ubiquitous language instructions. As mentioned above, examples of ubiquitous language action keyword data 262 includes, but is not limited to, "Cut," "Copy," "Paste," "Navigate," "Address," "URL," "ApplicationName," "Folder," "File," "Insert," "Update," "Delete," "OpenEmail," "SendEmail," "DeleteEmail," "CopyEmail," "Attachment," "ServerName," "DatabaseName," "OperatingSystemName," "ProjectName," "FileName," "Report," "Date," "Time," "Today," "Tomorrow," "Open," "Close," "Click," "Submit," "Select," "Value," "Yes," "No," "Not," "Cancel," "To," "From," and the like.

The system may identify these action keywords (in the ubiquitous language form) within the user input. As FIG. 7 shows, the system may identify certain action keywords as "Given" and "Action Keyword 1" in the given line 704. Additionally, the system can identify the action keywords "when" and "Action Keyword 2" in the when line 706. Furthermore, the system can identify the action keywords "and" and "Action Keyword 3" in the and line 708. Finally, the system can identify the action keywords "then" and "Action Keyword 3" in the then line 710.

The system can pair or group certain action keywords together. For example, using the user input shown in the display 700 of FIG. 7, the system could group together "when" and "Action Keyword 2" along with the ubiquitous language instructions that follow these action keywords as being one set of instructions in the user input.

The system may compare each word and/or phrase of the ubiquitous language instructions to an action keyword database (e.g., stored in the managing entity system, stored in the container system, or the like) to identify a match between a known action keyword and a word or phrase in the ubiquitous language instructions. The matched word or phrase in the ubiquitous language instructions can then be identified as an action keyword.

Identifying an action keyword for each instruction of the ubiquitous language instructions may, in some embodiments, involve identifying a format scheme of the ubiquitous language instructions, including known locations of the action keyword for each instruction of the ubiquitous language instructions within the format scheme. In such embodiments, the system may then extract the action keyword for each instruction of the ubiquitous language instructions at the known locations of the action keyword for each instruction of the ubiquitous language instructions within the format scheme.

Using the display 700 in FIG. 7 as an example, the system may determine that the format of the ubiquitous language instructions of the user input includes a first action keyword (i.e., "given," "when," "and," and "then") followed immediately by a second action keyword on each new line of the user input. This format may be part of a template (which may have been provided to the computing device of the user ahead of time), such that the system knows exactly where each of the action keywords of the user input will be positioned without having to compare each word or phrase in the user input to an action keyword database. In such an embodiment, the system can extract the first and second word or phrase of each line of the user input, and identify those words or phrases as the action keywords for the user input.

The process 600 may also include block 608, where the system compares the action keyword for each instruction of the ubiquitous language instructions to a conversion database to determine a set of execution steps associated with each action keyword. The conversion database may comprise a knowledge base or data repository with known or accepted action keywords and their paired execution steps. As mentioned above, the conversion database may automatically or manually update over time as new action keywords and/or execution steps are identified or received by the system. Additionally or alternatively, the conversion database may utilize machine learning algorithms to predict matches between certain action keywords and execution steps. The conversion database may automatically link these action keywords and execution steps or request confirmation from a specialist that the link is appropriate before linking the action keywords and execution steps in its database.

The conversion database may utilize a machine learning cruncher to populate a supervised learning database (e.g., based on input from the user and/or a specialist), test a link between an action keyword and an execution step in a virtual or non-production environment before confirming the link, and/or implement supervised machine learning automatically in response to determining that a new action keyword matches with an execution step.

At this point, the system can check to determine whether an execution step was identified for every action keyword. If no execution step was identified for an action keyword, of if an identified execution step is incompatible with other identified execution steps (e.g., identified as being associated with other action keywords), the system may transmit an error message to the computing device of the user to request a revised or new user input that fixes the error. This error message may include the original user input and the indication as to which action keyword did not appropriately match up with an execution step.

In some embodiments, the process 600 includes block 610, where the system transmits the set of execution steps to a robotic process automation (RPA) system that performs the set of execution steps. The RPA system is configured to access a workstation, server, network, computing device, and the like of the user and/or the overall managing entity system to perform the execution steps as if they were being performed by the user while the user is stationed at the workstation or other operational center. As such, the RPA system is configured to have the same permissions as the user, access to the same documents as the user, access to the email service as the user, and the like to enable the RPA system to perform these actions through the same mechanisms that the user would perform the actions. Of course, as the user is away from the user's workstation or other operational center, the user cannot perform these actions in a timely manner. Therefore, the RPA system is configured to automatically carry out the ubiquitous language instructions from the user, in the form of the execution steps.

The system may additionally compile or identify the execution steps with the supporting, directional, or otherwise instructional wording that follows or is otherwise associated with each keyword application. For example, an execution step may be to open a document. The ubiquitous language may include an action keyword phrase of "open document" that is immediately followed by the name and extension of the document and/or the location of the document within a database (e.g., file, folder, subfolder, and the like). As such, the system can compile an execution step as being to open the document with that specific document name or positioned at that specific location.

Next, the RPA system receives the set of execution steps, determines how each execution step should be performed, and performs each execution step as instructed. Non-limiting examples of the execution steps that the RPA system can perform are provided in blocks 612A through 612G. As shown, the RPA system may populate (e.g., draft, structure, write, generate, or the like) an electronic mail message with certain content, as shown in block 612A. The populated content may be provided through the ubiquitous language instructions, may be identifiable based on input from the ubiquitous language instructions, or the like. For example, an execution step may instruct the RPA system to open a document, identify a current value of a product that is listed in the document, extract that value of the product, and populate the email message with the extracted value of the product.

The execution steps that are performable by the RPA system may include the same instructions or concepts as noted in the action keywords of the ubiquitous language instructions. For example, an execution step may comprise "cut," "copy," "paste," and the like. Multiple execution steps may be performed in order or in unison to perform an overall execution step.

In some embodiments, the action keywords are transmitted directly to the RPA system. In such embodiments, the RPA system accesses the conversion database itself to identify the execution steps and/or computer readable instructions linked to the action keywords to determine which steps must be executed to carry out the ubiquitous language instructions.

As shown in block 612B, the RPA system may be configured and/or instructed to transmit an email message to a given email address. Using the sample display 700 in FIG. 7 as an example, the "then" line 710 may read "Then transmit email from Address1 to Address2." The system, in running process 600, will have converted the action keywords "transmit email" "from" and "to," along with supporting, directional, or otherwise instructional wording of "Address1" and "Address2" to cause the an electronic mail application on a workstation of the user to transmit an email (e.g., a previously generated email) from a first address (i.e., Address1), which may be an email address associated with the user, to a second address (i.e., Addreses2). In this way, the RPA system can utilize the action steps and the associated supporting, directional, or otherwise instructional wording to perform an execution step.

Block 612C illustrates one embodiment where the RPA system may be configured and/or instructed to attach a document or file to an email message. Looking to the sample display 700 of FIG. 7, the "and" line 708 may represent block 612C when the "and" line 708 reads "and attach [document name] to email," where the document name or location within a database is inserted in the document name field.

In some embodiments, the RPA system is configured and/or instructed to open, edit, or save an application or document, as shown in block 612D. As shown in block 612E, the RPA system may be configured and/or instructed to navigate an online site using a given uniform resource locator (URL). Block 612F illustrates one embodiment where the RPA system may be configured and/or instructed to adjust read, write, and/or access privileges for a document or application. In the final example, the RPA system may be configured and/or instructed to close, reset, or restart an application or operating system, as shown in block 612G.

Again, these examples of what the RPA system can be configured and/or instructed to perform are merely illustrative and are not meant to be limiting in any way. The RPA system may be configured to execute more than one of these steps, repeat one or more steps, and the like to accomplish the performance of the set of execution steps that are sent to the RPA system.

Referring now to FIG. 7, a sample display 700 of the mobile device system is provided to illustrate an example of the ubiquitous language user input, including format and other structure. As mentioned above, the scenario line 702 may include notes or other information about the user input that is not necessarily used to instruct the RPA system, but rather is used for documentation or note purposes.

The "given" line 704, "when" line 706, "and" line 708, and the "then" line 710 are all examples of how the ubiquitous language instructions may begin in this sample embodiment. These terms are merely examples, and other terms could be used to begin each line. For example, the "given" line 704 may actually start with the term "start," the phrase "begin by" or any other similar phrase that indicates an initial process step. Additionally, these lines could be in a different order. Of course, each of these lines is not necessary, and one or more of these lines may repeat. For example, if the user is not concerned about the timing of the overall process, or if the overall process should be executed automatically as soon as possible, the user may not include the "when" line 706. In other embodiments, when the user is concerned about when the process should be executed, the user may include the "when" line 706 along with any instructions for when the following process steps (provided in ubiquitous language instructions) should take place.

The "given" line 704 may be a starting point for the overall process. For example, the "given" line 704 may include an action keyword for navigating a URL, followed immediately by the web address to be input in the URL field by the RPA system.

The "when" line 706 may indicate when the user would like for the process to begin and/or complete. For example, the "when" line 706 may include an action keyword (e.g., Action Keyword 2) of "select date," "on date," "on," or any similar keyword in common vernacular that indicates that the process should begin or end on a certain date. This action keyword may be immediately followed by the date, or an indication of the date. For example, an actual date may be given, the term "today" may be given, a time of day may be given, a name for the day (e.g., "next Tuesday"), or the like.

The "and" line 708 may include any certain actions that should be completed before a final action is conducted. For example, the "and" line could be populated with action keywords like "open filename," "save filename," "attach filename to email," and the like. In particular, the "and" line may be repeated several times such that the user can input all desired action keywords (again, in the common vernacular) that the user desires to be executed by the RPA system.

The "then" line 710 may encompass a final or cumulative step that the user desires the RPA system to execute. For example, the "then" line 710 may include an action keyword of "SendEmail," "ApproveAccess," or the like. The supporting, directional, or otherwise instructional language that follows these action keywords may include an email address to which the email can be sent, the user and/or document to which access is approved, and the like.

As will be appreciated by one of skill in the art, the present invention may be embodied as a method (including, for example, a computer-implemented process, a business process, and/or any other process), apparatus (including, for example, a system, machine, device, computer program product, and/or the like), or a combination of the foregoing. Accordingly, embodiments of the present invention may take the form of an entirely hardware embodiment, an entirely software embodiment (including firmware, resident software, micro-code, and the like), or an embodiment combining software and hardware aspects that may generally be referred to herein as a "system." Furthermore, embodiments of the present invention may take the form of a computer program product on a computer-readable medium having computer-executable program code embodied in the medium.

Any suitable transitory or non-transitory computer readable medium may be utilized. The computer readable medium may be, for example but not limited to, an electronic, magnetic, optical, electromagnetic, infrared, or semiconductor system, apparatus, or device. More specific examples of the computer readable medium include, but are not limited to, the following: an electrical connection having one or more wires; a tangible storage medium such as a portable computer diskette, a hard disk, a random access memory (RAM), a read-only memory (ROM), an erasable programmable read-only memory (EPROM or Flash memory), a compact disc read-only memory (CD-ROM), or other optical or magnetic storage device.

In the context of this document, a computer readable medium may be any medium that can contain, store, communicate, or transport the program for use by or in connection with the instruction execution system, apparatus, or device. The computer usable program code may be transmitted using any appropriate medium, including but not limited to the Internet, wireline, optical fiber cable, radio frequency (RF) signals, or other mediums.

Computer-executable program code for carrying out operations of embodiments of the present invention may be written in an object oriented, scripted or unscripted programming language such as Java, Perl, Smalltalk, C++, or the like. However, the computer program code for carrying out operations of embodiments of the present invention may also be written in conventional procedural programming languages, such as the "C" programming language or similar programming languages.

Embodiments of the present invention are described above with reference to flowchart illustrations and/or block diagrams of methods, apparatus (systems), and computer program products. It will be understood that each block of the flowchart illustrations and/or block diagrams, and/or combinations of blocks in the flowchart illustrations and/or block diagrams, can be implemented by computer-executable program code portions. These computer-executable program code portions may be provided to a processor of a general purpose computer, special purpose computer, or other programmable data processing apparatus to produce a particular machine, such that the code portions, which execute via the processor of the computer or other programmable data processing apparatus, create mechanisms for implementing the functions/acts specified in the flowchart and/or block diagram block or blocks.

These computer-executable program code portions may also be stored in a computer-readable memory that can direct a computer or other programmable data processing apparatus to function in a particular manner, such that the code portions stored in the computer readable memory produce an article of manufacture including instruction mechanisms which implement the function/act specified in the flowchart and/or block diagram block(s).

The computer-executable program code may also be loaded onto a computer or other programmable data processing apparatus to cause a series of operational steps to be performed on the computer or other programmable apparatus to produce a computer-implemented process such that the code portions which execute on the computer or other programmable apparatus provide steps for implementing the functions/acts specified in the flowchart and/or block diagram block(s). Alternatively, computer program implemented steps or acts may be combined with operator or human implemented steps or acts in order to carry out an embodiment of the invention.

As the phrase is used herein, a processor may be "configured to" perform a certain function in a variety of ways, including, for example, by having one or more general-purpose circuits perform the function by executing particular computer-executable program code embodied in computer-readable medium, and/or by having one or more application-specific circuits perform the function.

Embodiments of the present invention are described above with reference to flowcharts and/or block diagrams. It will be understood that steps of the processes described herein may be performed in orders different than those illustrated in the flowcharts. In other words, the processes represented by the blocks of a flowchart may, in some embodiments, be in performed in an order other that the order illustrated, may be combined or divided, or may be performed simultaneously. It will also be understood that the blocks of the block diagrams illustrated, in some embodiments, merely conceptual delineations between systems and one or more of the systems illustrated by a block in the block diagrams may be combined or share hardware and/or software with another one or more of the systems illustrated by a block in the block diagrams. Likewise, a device, system, apparatus, and/or the like may be made up of one or more devices, systems, apparatuses, and/or the like. For example, where a processor is illustrated or described herein, the processor may be made up of a plurality of microprocessors or other processing devices which may or may not be coupled to one another. Likewise, where a memory is illustrated or described herein, the memory may be made up of a plurality of memory devices which may or may not be coupled to one another.

While certain exemplary embodiments have been described and shown in the accompanying drawings, it is to be understood that such embodiments are merely illustrative of, and not restrictive on, the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations and modifications of the just described embodiments can be configured without departing from the scope and spirit of the invention. Therefore, it is to be understood that, within the scope of the appended claims, the invention may be practiced other than as specifically described herein.

The invention claimed is:

1. A system for converting ubiquitous language instructions to robotic process automation executable action steps and executing the action steps, the system comprising:
   a memory device; and
   a processing device operatively coupled to the memory device, wherein the processing device is configured to execute computer-readable program code to:
      receive an encrypted user input from a computing device of a specialist, wherein the user input comprises ubiquitous language instructions;
      decrypt the encrypted user input to identify the ubiquitous language instructions;
      identify an action keyword for each instruction of the ubiquitous language instructions, wherein identifying the action keyword for each instruction of the ubiquitous language instructions comprises:
         identifying a format scheme of the ubiquitous language instructions, including known locations of the action keyword for each instruction of the ubiquitous language instructions within the format scheme; and
         extracting the action keyword for each instruction of the ubiquitous language instructions at the known locations of the action keyword for each instruction of the ubiquitous language instructions within the format scheme;
      compare the action keyword for each instruction of the ubiquitous language instructions to a conversion database to determine a set of execution steps associated with each action keyword; and
      transmit the set of execution steps to a robotic process automation system, wherein the robotic process automation system is configured to perform the set of execution steps.

2. The system of claim 1, wherein the encrypted user input is received in a short message service text messaging form.

3. The system of claim 1, wherein the encrypted user input comprises a unique token associated with a user, and wherein the unique token is associated with an encryption key for decrypting the encrypted user input.

4. The system of claim 1, wherein the processing device is further configured to execute the computer-readable program code to:
   analyze the ubiquitous language instructions for errors; and
   in response to detecting an error in the ubiquitous language instructions, transmit a notification comprising an indication of the error and a request for a new user input to the computing device of a user; or
   in response to determining that no error exists in the ubiquitous language instructions, transmit the ubiquitous language instructions to the robotic process automation system.

5. The system of claim 1, wherein the conversion database comprises a knowledge base or data repository with known or accepted action keywords and their paired execution steps.

6. The system of claim 1, wherein the set of execution steps comprises at least one of populating an email message with content; transmitting an email message to a given email address; attaching a document or file to an email message; opening an application or document on a workstation; saving an application or document on a workstation; navigating an online site using a uniform resource locator; adjusting read, write, or access privileges for a document or application; and closing, opening, or restarting an application or operating system.

7. A computer program product for converting ubiquitous language instructions to robotic process automation executable action steps and executing the action steps, the computer program product comprising at least one non-transitory computer readable medium comprising computer readable instructions, the instructions comprising instructions for:
   receiving an encrypted user input from a computing device of a specialist, wherein the user input comprises ubiquitous language instructions;
   decrypting the encrypted user input to identify the ubiquitous language instructions; identifying an action keyword for each instruction of the ubiquitous language instructions, wherein identifying the action keyword for each instruction of the ubiquitous language instructions comprises:
      identifying a format scheme of the ubiquitous language instructions, including known locations of the action keyword for each instruction of the ubiquitous language instructions within the format scheme; and
      extracting the action keyword for each instruction of the ubiquitous instructions at the known locations of the action keyword for each instruction of the ubiquitous language instructions within the format scheme;
   comparing the action keyword for each instruction of the ubiquitous language instructions to a conversion database to determine a set of execution steps associated with each action keyword; and
   transmitting the set of execution steps to a robotic process automation system, wherein the robotic process automation system is configured to perform the set of execution steps.

8. The computer program product of claim 7, wherein the encrypted user input is received in a short message service text messaging form.

9. The computer program product of claim 7, wherein the encrypted user input comprises a unique token associated with a user, and wherein the unique token is associated with an encryption key for decrypting the encrypted user input.

10. The computer program product of claim 7, wherein the computer readable instructions further comprise instructions for:
- analyzing the ubiquitous language instructions for errors; and
- in response to detecting an error in the ubiquitous language instructions, transmitting a notification comprising an indication of the error and a request for a new user input to the computing device of a user; or
- in response to determining that no error exists in the ubiquitous language instructions, transmitting the ubiquitous language instructions to the robotic process automation system.

11. The computer program product of claim 7, wherein the conversion database comprises a knowledge base or data repository with known or accepted action keywords and their paired execution steps.

12. The computer program product of claim 7, wherein the set of execution steps comprises at least one of populating an email message with content; transmitting an email message to a given email address; attaching a document or file to an email message; opening an application or document on a workstation; saving an application or document on a workstation; navigating an online site using a uniform resource locator; adjusting read, write, or access privileges for a document or application; and closing, opening, or restarting an application or operating system.

13. A computer implemented method for converting ubiquitous language instructions to robotic process automation executable action steps and executing the action steps, said computer implemented method comprising:
- providing a computing system comprising a computer processing device and a non-transitory computer readable medium, where the computer readable medium comprises configured computer program instruction code, such that when said instruction code is operated by said computer processing device, said computer processing device performs the following operations:
  - receiving an encrypted user input from a computing device of a specialist, wherein the user input comprises ubiquitous language instructions;
  - decrypting the encrypted user input to identify the ubiquitous language instructions;
  - identifying an action keyword for each instruction of the ubiquitous language instructions, wherein identifying the action keyword for each instruction of the ubiquitous language instructions comprises:
    - identifying a format scheme of the ubiquitous language instructions, including known locations of the action keyword for each instruction of the ubiquitous language instructions within the format scheme; and
    - extracting the action keyword for each instruction of the ubiquitous language instructions at the known locations of the action keyword for each instruction of the ubiquitous language instructions within the format scheme;
  - comparing the action keyword for each instruction of the ubiquitous language instructions to a conversion database to determine a set of execution steps associated with each action keyword; and
  - transmitting the set of execution steps to a robotic process automation system, wherein the robotic process automation system is configured to perform the set of execution steps.

14. The computer implemented method of claim 13, wherein the encrypted user input is received in a short message service text messaging form.

15. The computer implemented method of claim 13, wherein the encrypted user input comprises a unique token associated with a user, and wherein the unique token is associated with an encryption key for decrypting the encrypted user input.

16. The computer implemented method of claim 13, wherein the computer readable instructions further comprise instructions for:
- analyzing the ubiquitous language instructions for errors; and
- in response to detecting an error in the ubiquitous language instructions, transmitting a notification comprising an indication of the error and a request for a new user input to the computing device of a user; or
- in response to determining that no error exists in the ubiquitous language instructions, transmitting the ubiquitous language instructions to the robotic process automation system.

17. The computer implemented method of claim 13, wherein the conversion database comprises a knowledge base or data repository with known or accepted action keywords and their paired execution steps.

* * * * *